US011824030B2

(12) United States Patent
Kapusta et al.

(10) Patent No.: US 11,824,030 B2
(45) Date of Patent: Nov. 21, 2023

(54) MECHANICAL PUNCHED VIA FORMATION IN ELECTRONICS PACKAGE AND ELECTRONICS PACKAGE FORMED THEREBY

(71) Applicant: General Electric Company, Schenectady, NY (US)

(72) Inventors: Christopher James Kapusta, Delanson, NY (US); Youichi Nishihara, Nagano (JP)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/806,132

(22) Filed: Jun. 9, 2022

(65) Prior Publication Data

US 2022/0302063 A1 Sep. 22, 2022

Related U.S. Application Data

(63) Continuation of application No. 15/929,925, filed on May 29, 2020, now Pat. No. 11,398,445.

(51) Int. Cl.
*H01L 21/48* (2006.01)
*H01L 23/00* (2006.01)

(52) U.S. Cl.
CPC .............. *H01L 24/19* (2013.01); *H01L 24/20* (2013.01)

(58) Field of Classification Search
CPC ......... H01L 2224/19; H01L 2224/2105; H01L 2224/214; H01L 2224/95; H01L 2224/92144; H01L 21/486; H01L 24/19–20

USPC ............................................................ 257/123
See application file for complete search history.

(56) References Cited

U.S. PATENT DOCUMENTS

| | | | | |
|---|---|---|---|---|
| 2007/0096311 A1* | 5/2007 | Humpston | ........... | H03H 9/1057 257/734 |
| 2011/0221041 A1* | 9/2011 | Lin | ........... | H01L 21/568 257/E23.116 |
| 2017/0207160 A1* | 7/2017 | Gowda | ........... | H01L 25/16 |

* cited by examiner

*Primary Examiner* — Didarul A Mazumder
(74) *Attorney, Agent, or Firm* — Ziolkowski Patent Solutions Group, SC

(57) ABSTRACT

An electronics package includes an electrically insulating substrate having a first surface and a second surface, an adhesive layer positioned on the first surface of the electrically insulating substrate, and an electrical component having a top surface coupled to the adhesive layer on a surface thereof opposite the electrically insulating substrate, the electrical component having contact pads on the top surface. Vias are formed through the electrically insulating substrate and the adhesive layer at locations corresponding to the contact pads by way of a mechanical punching operation, with each of the vias having a via wall extending from the second surface of the electrically insulating substrate to a respective contact pad. At each via, the electrically insulating substrate comprises a protrusion extending outwardly from the first surface thereof so as to cover at least part of the adhesive layer in forming part of the via wall.

23 Claims, 8 Drawing Sheets

MECHANICAL PUNCHED VIA FORMATION IN ELECTRONICS PACKAGE AND ELECTRONICS PACKAGE FORMED THEREBY

CROSS-REFERENCE TO RELATED APPLICATION

The present application is a continuation of, and claims priority to, U.S. patent application Ser. No. 15/929,925, filed May 29, 2020, the disclosure of which is incorporated herein by reference in its entirety.

BACKGROUND OF THE INVENTION

Embodiments of the invention relate generally to structures and methods for packaging semiconductor devices and, more particularly, to a power electronics package structure having vias formed by a mechanical punching operation, with the vias providing for formation of metal interconnects down to a power device, such as by a power overlay (POL) interconnect formation process.

Electronics packaging is a method for constructing electronic circuits packages or modules in which one or more semiconductor devices and/or passive devices are incorporated within a package structure that provides electrical connections and protection to the devices—such that a "multi-chip module" (MCM) might be provided, for example. The package structure then enables connection of the package/module to the surface of printed circuit boards (PCBs) or other similar external circuits, for example. An example of one such electronics package structure is a power electronics package structure or module formed using a POL process.

The technique for packaging semiconductor devices and passive devices using a POL process typically begins with placement of one or more semiconductor or passive devices onto a dielectric layer by way of an adhesive, with the dielectric layer covering the active side of each device. Vias are formed through the dielectric layer and adhesive—either prior or subsequent to attachment of the device(s)—and metal interconnects are then electroplated onto the dielectric layer and in/through the vias (i.e., metallized vias) to form a direct metallic connection to the device(s). In embodiments where a device is a power semiconductor device, the metal interconnects may be formed as thicker POL interconnects. The interconnects may be routed through additional laminate re-distribution layers, if desired, and an input/output system is provided to enable surface mounting of the package onto the PCB or external circuit. An embedding compound may then be applied about the device(s) to encapsulate the device(s) therein.

The formation of vias in the package structure may be performed according to any of a number of known techniques and, in embodiments where vias are formed prior to attachment of an electronic component, vias may be formed only through a dielectric layer or formed through both a dielectric layer and an adhesive layer applied thereto. In embodiments where vias are formed through just the dielectric layer, such as when making a double-sided flex circuit, the vias may be formed by processes such as laser drilling or ablation, plasma etching, wet etching, water jetting, photo-definition, mechanical punching, or mechanical drilling. In embodiments where vias are formed through both the dielectric layer and the adhesive layer, the vias may be formed by processes such as laser drilling or ablation, plasma etching, wet etching, water jetting, or photo-definition, but mechanical punching and/or mechanical drilling is avoided due to issues with adhesive building-up on the mechanical punching/drilling tool. Also, regarding via formation using mechanical punching, it is recognized that mechanical punching is limited to "larger" via diameters and pitches.

In each of the above described techniques presently employed for forming vias through a dielectric layer or through both a dielectric layer and adhesive layer, drawbacks exist with regard to the throughput achievable using such systems/techniques. That is, it is recognized that using techniques such as laser drilling or ablation (for larger diameter vias), plasma etching, wet etching, water jetting, or photo-definition result in a lower throughput than is achievable with mechanical punching/drilling techniques. Additionally, where existing mechanical punching/drilling techniques are presently used, such techniques are not suitable for punching/drilling through both the dielectric layer and adhesive layer—but rather only the dielectric layer is punched/drilled and an adhesive must subsequently be applied to the dielectric layer, thereby also lowering/limiting throughput rates. As semiconductor chip packaging technology continues to evolve, such limits on the throughput rate are considered to be a major impediment.

It is therefore desirable to provide a system/technique for forming vias through a dielectric layer and adhesive layer that provides for high throughput. It is further desirable for such a system/technique to provide a package structure where the vias are free from burrs and limit adhesive encroachment into the vias, so as to provide a package structure with acceptable performance and reliability.

BRIEF DESCRIPTION OF THE INVENTION

In accordance with one aspect of the invention, an electronics package includes an electrically insulating substrate having a first surface and a second surface, an adhesive layer positioned on the first surface of the electrically insulating substrate, and an electrical component having a top surface coupled to the adhesive layer on a surface thereof opposite the electrically insulating substrate, the electrical component having one or more contact pads on the top surface. One or more vias are formed through the electrically insulating substrate and the adhesive layer at locations corresponding to respective ones of the one or more contact pads, each of the one or more vias having a via wall extending from the second surface of the electrically insulating substrate to a respective contact pad. At each via, the electrically insulating substrate comprises a protrusion extending outwardly from the first surface thereof so as to cover at least part of the adhesive layer in forming part of the via wall.

In accordance with another aspect of the invention, a method for manufacturing an electronics package includes providing an electrically insulating substrate, applying or forming an adhesive layer on a first surface of the electrically insulating substrate, and forming one or more vias through the electrically insulating substrate and the adhesive layer, each of the one or more vias defined by a via wall. The one or more vias are formed by mechanically punching the one or more vias through the electrically insulating substrate and the adhesive layer using a mechanical punching tool, with the one or more vias being mechanically punched through the electrically insulating substrate and the adhesive layer from a second surface side of the electrically insulating substrate, through the electrically insulating substrate and then through the adhesive layer.

In accordance with still another aspect of the invention, an electronics package is provided that is formed by a process including providing an electrically insulating substrate having a first surface and a second surface, applying or forming an adhesive layer on the first surface of the electrically insulating substrate, and forming one or more vias through the electrically insulating substrate and the adhesive layer by mechanically punching the one or more vias through the electrically insulating substrate and the adhesive layer using a mechanical punching tool positioned on the second surface side of the electrically insulating substrate, each of the one or more vias defined by a via wall. The mechanical punching of the one or more vias through the electrically insulating substrate and the adhesive layer from the second surface side of the electrically insulating substrate forms a protrusion on the electrically insulating substrate at each via that extends outwardly from the first surface, so as to cover at least part of the adhesive layer and form part of the via wall.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for an electronics package structure having vias formed by a mechanical punching operation. The electronics package includes an electrically insulating substrate and adhesive layer having vias formed therethrough each defined by a via wall, wherein at each via the electrically insulating substrate includes a protrusion extending outwardly from a surface thereof, around a perimeter of the via, so as to cover at least part of the adhesive layer in forming part of the via wall.

While the various embodiments of an electronics package referenced below are shown and described as including a particular arrangement of a semiconductor device or devices, vias, and interconnection wiring, it is understood that alternative arrangements and configurations could also be implemented, and thus embodiments of the invention are not limited only to the specifically illustrated devices and package constructions. That is, it is understood that other combinations of differently configured electrical components could be substituted in the electronics package, and thus embodiments of the invention are not limited only to the illustrated embodiments. As used herein the term "electrical component" may be understood to encompass any of the various types of semiconductor devices described above as well as resistors, capacitors, inductors, filters, and other circuit devices, and it is to be understood that mechanically punched vias, as described in greater detail here below, can be used to interconnect to any of these devices.

Figure 1:
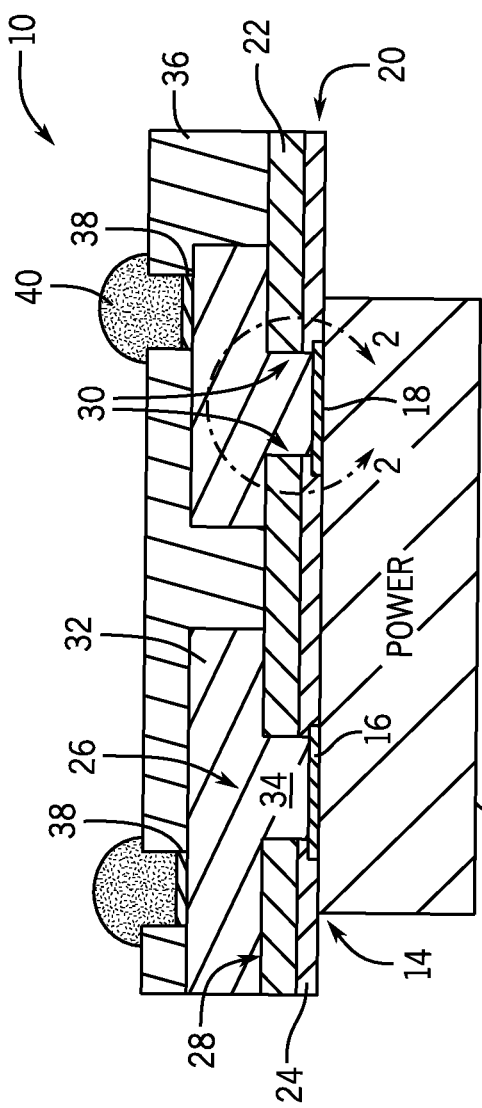
FIG. 1 is a schematic cross-sectional side view of an electronics package, according to an embodiment of the invention.

Referring now to FIG. 1, a cross-sectional schematic view of an electronics package 10 is illustrated that includes at least one electrical component 12, according to one embodiment. Electrical component 12 may be a power semiconductor component or chip 12 (and is described hereafter as such) that has an active surface 14 with at least one contact pad or I/O pad 16, 18 thereon. The active surface 14 of power semiconductor chip 12 is coupled to the first surface 20 of an electrically insulating substrate 22 or support substrate by way of an adhesive layer 24. According to various embodiments, insulating substrate 22 may be provided in the form of an insulating film or dielectric substrate, such as for example a Kapton® laminate flex, an organic film or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AN, ceramic, or glass, as non-limiting examples. The adhesive layer 24 is composed of a bonding material that is preferably a non-electrically conducting polymeric material (e.g., epoxy, liquid crystal polymer, ceramic or metal filled polymers) or other organic material as non-limiting examples. Examples of suitable bonding materials include ePDA or other Henkel adhesives, for example.

As shown in FIG. 1, at least one via 26 extends between the first surface 20 and second surface 28 of insulating substrate 22 and through adhesive layer 24, with two vias illustrated in FIG. 1—each of the vias 26 defined by a via wall 30. Vias 26 are aligned with the I/O pad(s) 16, 18 of the power semiconductor chip 12. An electrically conductive first interconnect layer 32 or power interconnect layer is disposed on a portion of the second surface 28 of insulating substrate 22. The first interconnect layer 32 extends into the vias 26, forming conductive vias 34, and also extends onto the I/O pad(s) 16, 18 of power semiconductor chip 12. In the illustrated embodiment, power semiconductor chip 12 includes two I/O pads 16, 18 on active surface 14. In some preferred embodiments, I/O pad 16 is a gate pad and covers a smaller area than I/O pad 18, which could be a source pad. In such an embodiment, a via 26 formed down to a gate I/O pad 16 may have a diameter of 300 micrometers, while a via 26 formed down to a source I/O pad 18 may have a diameter of 500 micrometers While power semiconductor chip 12 is illustrated in FIG. 1 as including two I/O pads 16, 18, it may have three or more I/O pads in some alternative embodiments or may include only one topside I/O pad in another alternative embodiment, such as where element 12 is a power diode for example. In an alternative embodiment, electrical component 12 is provided as a logic semiconductor chip, the chip may have as few as four I/O pads or may have more than ten, hundreds, or thousands of I/O pads. In another alternative embodiment, electrical component 12 is provided as a resistor, capacitor, or feed thru shim, for example, that may have one contact pad or multiple contact pads.

First interconnect layer 32 is an electrically conductive material and, preferably, is composed of one or more metals such as aluminum, copper, gold, silver, nickel, or combinations thereof as non-limiting examples, i.e., metallized vias.

Alternatively, first interconnect layer 32 may be an electrically conductive polymer or formed using inks that contain conductive metal particles. First interconnect layer 32 may be composed of a barrier or adhesion layer, a seed layer, and a relatively thick layer of bulk material that is plated atop the seed and barrier layers achieving the desired conductive layer thickness. In alternative embodiments, the barrier layer and/or the seed layer may be omitted from first interconnect layer 32. The barrier layer, when used, is applied to the insulating substrate 22 prior to application of the seed layer and bulk material. The barrier layer may include titanium or chromium, as non-limiting examples. When used, seed metal layer may be an electrically conductive material such as copper, as one non-limiting example. The layer of bulk material is plated up to achieve the desired thickness of first interconnect layer 32. The bulk material portion of first interconnect layer 32 includes at least one electrically conductive material such as copper, aluminum, or other standard wiring material. In some embodiments the barrier layer may have a thickness in the approximate range of 0.1 to 0.4 microns, the seed metal layer may have a thickness in the approximate range of 1 to 3 microns and the bulk layer may have a thickness in the approximate range of 10 to 100 microns. However, other materials at other thicknesses can be used to form first interconnect layer 32 based on design requirements.

In some embodiments, a solder mask layer or other insulating material 36 may be applied over the exposed top surfaces of the first interconnect layer 32 and the insulating layer 22 to provide a protective coating and define a location for interconnect pads. A capping layer 38 can then be applied to the top surface of these interconnect pads, such as Eless Ni/Au or ENIPG, to provide a solderable wirebondable finish. A series of input/output (I/O) connections 40 would then be formed to provide a route for electrical connections between the power semiconductor chip 12 and external components (not shown) such as, for example a busbar or printed circuit board (PCB). Such I/O connections may be provided in the form of plated bumps or pillar bumps, as non-limiting examples.

While not shown in FIG. 1, it is recognized that when electronics package 10 is a power module, a DBC substrate can be attached to the back side of the power semiconductor chip 12. An encapsulant or insulating material may then be used to underfill between the insulating substrate 22 and the DBC substrate. It is also recognized that additional insulating layers and interconnect layers, e.g., a second insulating layer and second interconnect layer, could be provided in the electronics package 10. Such insulating layers and interconnect layers could be applied over first interconnect layer 32 to provide for further redistribution of electrical connections between the power semiconductor chip 12 and external components.

Figure 2:
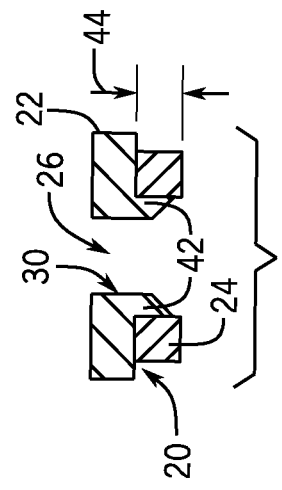
FIG. 2 is a detailed view of a portion of the electronics package of FIG. 1.

A more detailed view of the vias 26 formed through the insulating substrate 22 and adhesive layer 24 is shown in FIG. 2. As can be seen in FIG. 2, formation of the vias 26 through the insulating substrate 22 and adhesive layer 24 results in a deformation of the insulating substrate 22. At locations corresponding to each of the vias 26, the insulating substrate 22 includes a protrusion or "fang" artifact 42 that extends outwardly from the first surface 20 of the insulating substrate 22 and toward adhesive layer 24, with the protrusion 42 formed around the perimeter of the punched via 26. According to embodiments of the invention, the protrusion 42 may extend outwardly from the first surface 20 so as to cover all, substantially all, or a majority of the adhesive layer 24 in forming at least part of the via wall 30. For example, the protrusion 42 may extend outwardly from the first surface 20 so as to cover 50% or more of a thickness 44 of the adhesive layer 24—with the thickness of the adhesive layer 24 being 5-50 micrometers, for example. The via wall 30 may therefore be entirely formed of insulating substrate material or substantially formed of insulating substrate material. The protrusion 42 functions as a dam that prevents the flow or encroachment of adhesive into the via 26, so as enable formation of vias 26 having a consistent shape and so that the adhesive encroachment does not reduce the via metal contact area, thus providing a more robust and reliable metal connection to the I/O pad 16, 18.

Referring now to FIGS. 3-15, a technique for manufacturing the electronics package 10 of FIG. 1 is set forth, according to an embodiment of the invention. A cross-section of the build-up process for a singular electronics package 10 is shown in each of FIGS. 3-15 for ease of visualization of the build-up process. However, one skilled in the art will recognize that multiple electronics packages could be manufactured in a similar manner at the panel level and then singulated into individual electronics packages as desired.

Figure 3:
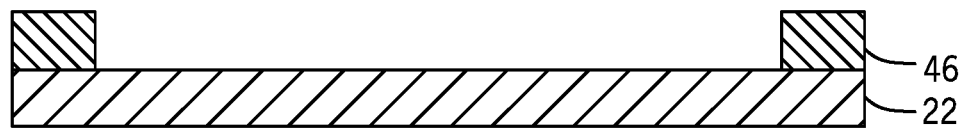
FIGS. 3-15 are schematic cross-sectional side views of the electronics package of FIG. 1 during various stages of a manufacturing/build-up process, according to an embodiment of the invention.

Referring first to FIG. 3, fabrication of electronics package 10 begins by securing insulating substrate 22 on a perimeter frame 46 that provides support during build-up of the electronics package 10, with it being recognized that the frame 46 could hold arrays of multiple electronics packages for batch processing.

Figure 4:
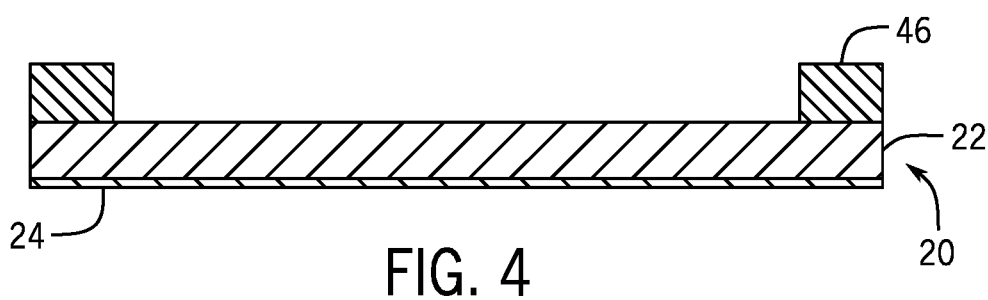

Upon securing of the insulating substrate 22 on perimeter frame 40, an adhesive layer 24 (i.e., layer of bonding material) is applied to a first surface 20 of insulating substrate 22, as shown in FIG. 4. In the illustrated embodiment, adhesive layer 24 is applied such that it coats the entirety of the first surface 20. In alternative embodiments, adhesive layer 24 may be applied to coat only select portions of the first surface 20 of insulating substrate 22. Adhesive layer 24 may be applied using a lamination or spray process or by using a coating technique such as spin coating or slot die coating, as non-limiting examples. While the adhesive layer 24 is shown/described as being applied to the first surface 20 of the insulating substrate, it is recognized that the adhesive layer 24 could instead be applied to the second surface 28 of the insulating substrate 22, i.e., in either a "frame up" or "frame down" set-up, according to embodiments of the invention.

Figure 5:
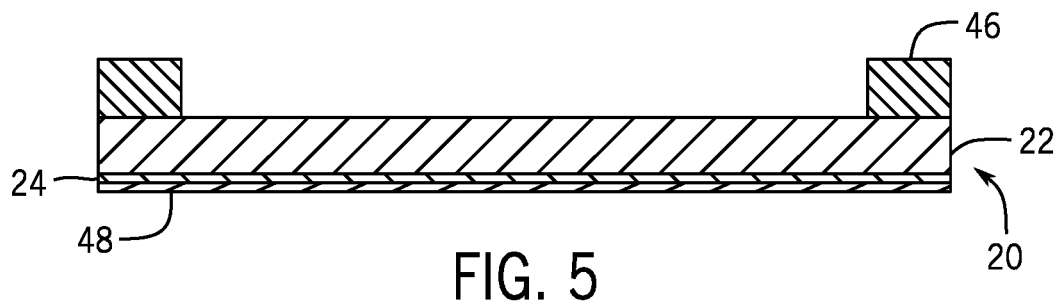

Upon application of the adhesive layer 24, a release liner 48 is applied over the adhesive, as shown in FIG. 5. The release liner 48 provides for a subsequent step of via formation through the insulating substrate 22 and adhesive layer 24, as will be explained in greater detail here below.

Figure 6:
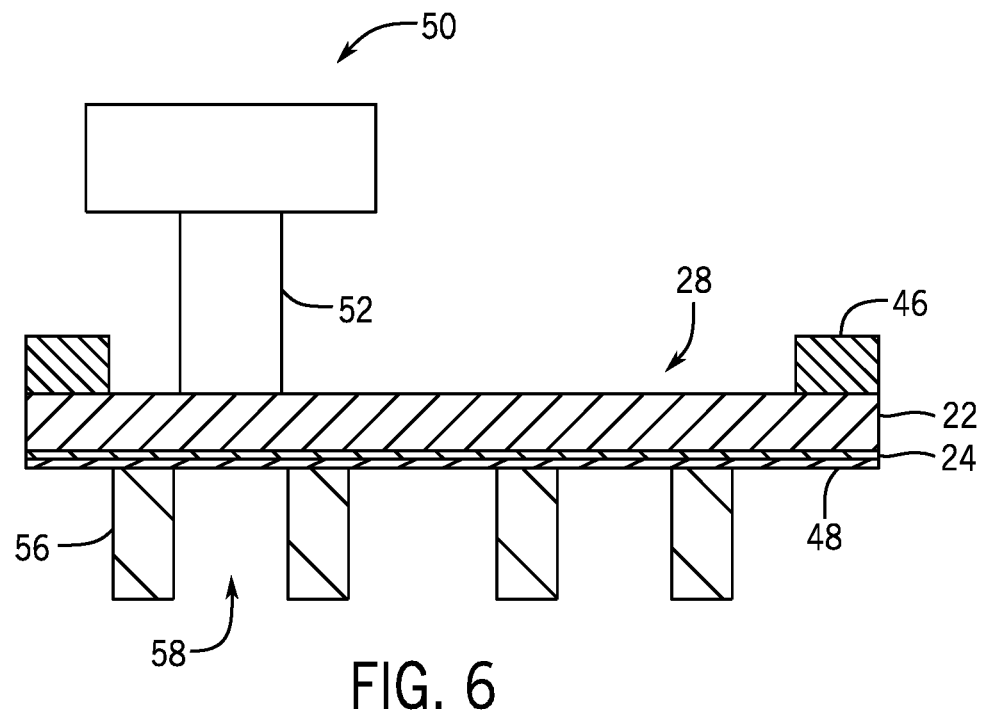
Figure 7:
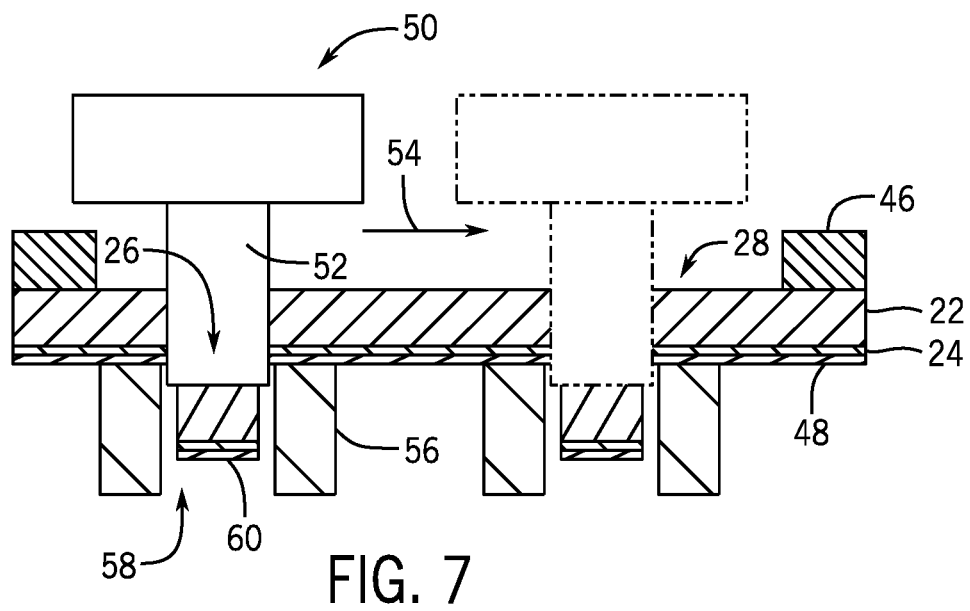

Referring now to FIGS. 6 and 7, upon application of adhesive layer 24 and release liner 48, the method continues by forming vias 26 through insulating substrate 22 and adhesive layer 24 (and release liner 48). The size, shape, and location of vias 26 are dictated based on the design of the power circuit and the location, size, and current requirements of the electrical component(s) to be included in the electronics package, such as a power semiconductor chip 12 (FIG. 1) or other logic chips or passive devices.

According to an exemplary embodiment, the vias 26 are formed by a mechanical punching tool 50 that operates to punch through the layers 22, 24, 48 and thereby form the vias. As shown in FIG. 6, the mechanical punching tool 50 is positioned adjacent the second surface 28 of insulating substrate 22 (having frame attached thereto) such that vias 26 are punched from the insulating substrate side—i.e., punching first through the insulating substrate 22 and then through the adhesive layer 24 and release liner 48. The mechanical punching tool 50 is illustrated in FIG. 6 as including only a single punch 52 that would move relative to electronics package 10 (as indicated by arrow 54 and mechanical punching tool 50 moved to a next position, in phantom) to form vias 26 one at a time at desired locations, but it is recognized that the punching tool 50 may be a multi-punch tool that simultaneously forms multiple vias 26, an example of which will be described later on. Furthermore, while mechanical punching tool 50 is shown/described hereafter as being positioned to punch down through insulating substrate 22, adhesive layer 24, and release liner 48, it is recognized that mechanical punching tool 50 could be positioned to punch up through insulating substrate 22, adhesive layer 24, and release liner 48—depending on whether a "frame up" or "frame down" set-up is employed.

As further shown in FIG. 6, positioned on the opposite side of the electronics package 10 adjacent release liner 48 are one or more dies 56 that interact with the punching tool 50 to provide stability during via formation. The die(s) 56 include a hollow central area 58 that is aligned with the punching tool 50, at a location or locations where it is desired to form vias 26.

As shown in FIG. 7, the mechanical punching tool 50 is operated to form vias 26 through the layers 22, 24, 48, with the punch 52 being actuated down to punch through the insulating substrate 22, adhesive layer 24, and release liner 48. According to one embodiment, the punch 52 is structured to form a via 26 that is shaped as a straight-sided circular hole, although it is recognized that the via 26 could have other alternate configurations, such as a circular via with angled side surfaces or a via of a different shape, such as an oval, square, or triangle, for example. Upon the punch 52 being actuated down to punch through the layers 22, 24, 48, a plug 60 (of layers) cut from the via locations is punched out and exits through the hollow central area 58 of the die 56.

Formation of vias 26 by punching from the insulating substrate side results not only in removal of plugs 60, but also causes additional deformation of the insulating substrate 22 in areas thereof corresponding to the vias 26. That is, at locations corresponding to each of the vias 26, insulating substrate material is forced downward by the punch 52 so as to form a protrusion 42 (fang artifact) that extends outwardly from the first surface 20 of the insulating substrate 22 and toward adhesive layer 24, as illustrated in FIG. 2. According to embodiments of the invention, the protrusion 42 may extend outwardly from the first surface 20 so as to cover all of or substantially all of the adhesive layer 24 (e.g., 50% or more of a thickness 44 of the adhesive layer 24) in forming at least part of the via wall 30. The via wall 30 may therefore be entirely formed of insulating substrate material or substantially formed of insulating substrate material. The protrusion 42 functions as a dam around the perimeter of the via 26 that prevents/minimizes the flow or encroachment of adhesive into the via.

As indicated above, the size of vias 26 may be dictated based on the design of the electronics package 10 and the requirements of the electrical component(s) to be included in the electronics package, such as a power semiconductor chip 12 (FIG. 1) or other logic chips or passive devices. For example, in embodiments where a power semiconductor chip 12 includes a gate I/O pad 16 and a source I/O pad 18, a via 26 formed down to a gate I/O pad 16 may have a diameter of 300 micrometers, while a via 26 formed down to a source I/O pad 18 may have a diameter of 500 micrometers. In an embodiment where a logic semiconductor chip 12 includes I/O pads with a tighter pitch, vias 26 formed down to these pads may have a diameter of 80 to 100 micrometers, for example. With such smaller vias 26, it is recognized that a follow-up laser drilling operation (not shown) may be desirable subsequent to punching of the vias 26, in order to form vias 26 of suitable quality (e.g., burr removal, etc.) for small via diameters Referring now to FIG. 8, upon formation of the vias 26, the release liner 48 is removed from the adhesive layer 24 and power semiconductor chip 12 is then attached to the adhesive layer 24 and cured in place. The active surface 14 of the power semiconductor chip 12 is attached to adhesive layer 24 such that I/O pad(s) 16, 18 face the adhesive layer 24 and insulating substrate 22. The second surface 28 of insulating substrate 22, vias 26, and exposed areas of I/O pads 16, 18 are subsequently cleaned, such as through a reactive ion etching (RIE), plasma etch, or chemical etch to perform a desoot process.

Figure 8:
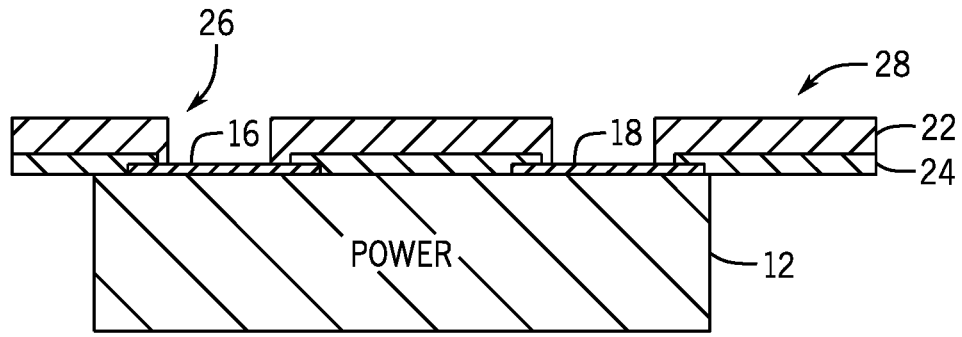
Figure 9:
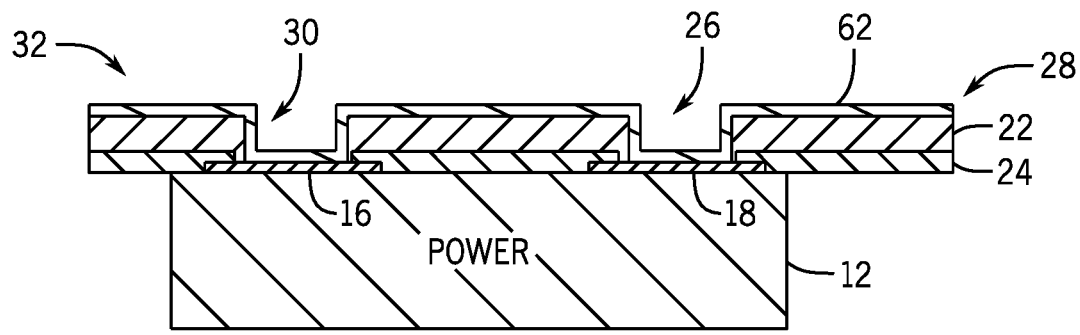

While not shown in FIG. 8, it is recognized that—after curing of the adhesive layer 24—a laser drilling step could be subsequently performed using known techniques in order to make finer vias (e.g., <50 micrometers in diameter) to provide connections to devices such as digital ASIC or driver circuits that have finer pad pitch or even smaller pad sizes, and that mechanical punching cannot accommodate.

The manufacturing process continues in by forming and patterning first interconnect layer 32. According to one embodiment, and as shown in FIGS. 9-12, first interconnect layer 32 is formed using a semi-additive plating technique. Manufacture of first interconnect layer 32 begins in FIG. 9 by applying a seed metal 62 to the second surface 28 of insulating substrate 22, onto the via walls 30 of vias 26, and onto exposed portions of the I/O pad(s) 16, 18. Seed metal 62 may be applied by sputtering, evaporation, electroless plating, or any other standard metal deposition process. A barrier coating (not shown) can optionally be applied prior to seed metal 62 to enhance adhesion and reliability. When used, the barrier metal likewise may be applied by sputtering, evaporation, or any other standard metal deposition process.

Figure 10:
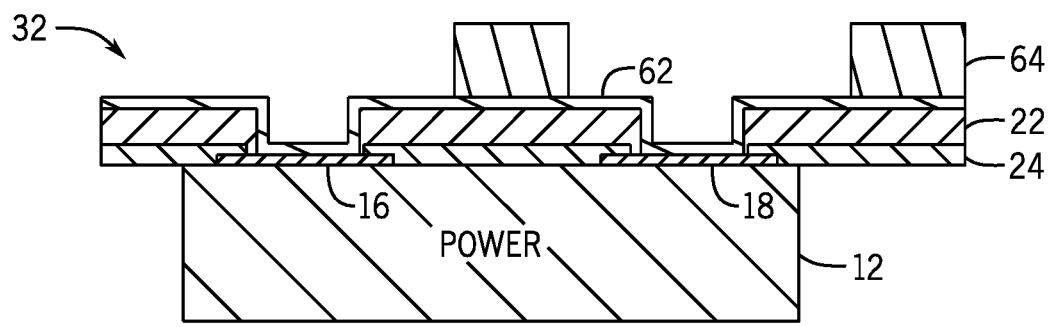
Figure 11:
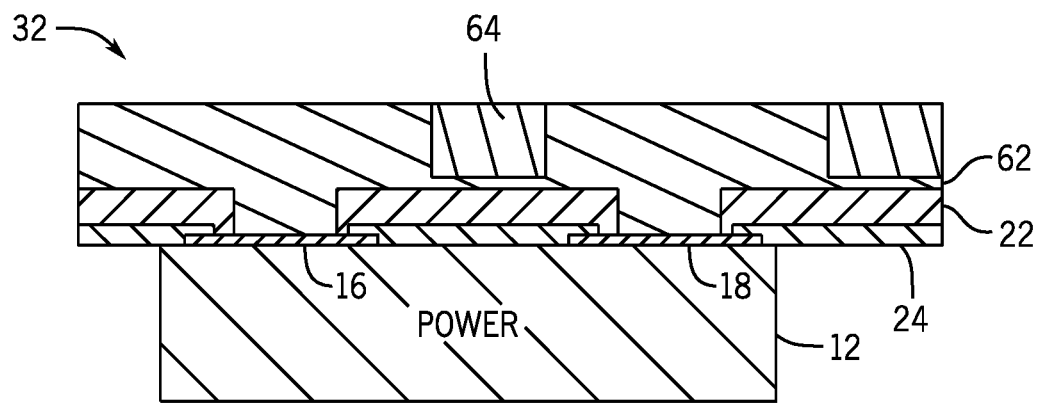

As depicted in FIG. 10, a photoresist mask 64 is applied over the seed metal 62 and photo-patterned to form openings. The photoresist mask 64 can be applied by spray coating, spin coating, or electro plating (electrophoretic resist). In a next step of the manufacturing process, shown in FIG. 11, the exposed areas of the seed metal 62 are patterned plated up with a bulk material (e.g., copper) by an electro-plating technique until first interconnect layer 32 reaches a desired thickness.

Figure 12:
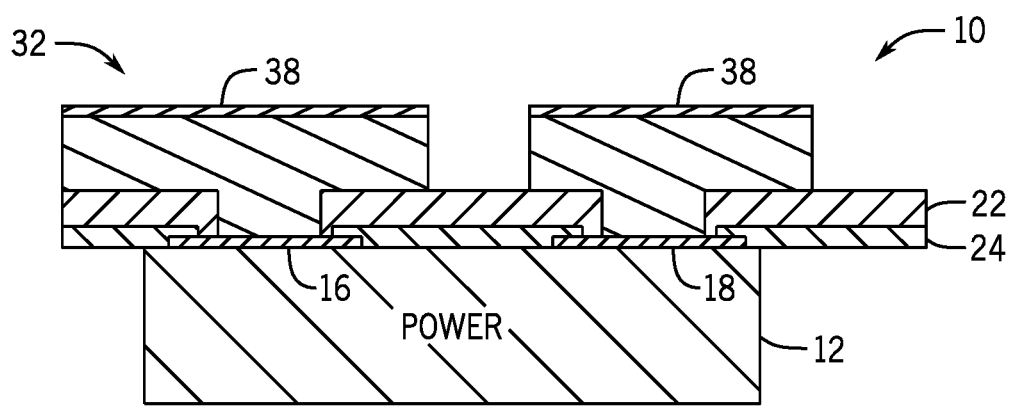

Referring now to FIG. 12, following the patterned plate-up of the first interconnect layer 32, the remaining photoresist mask 64 is removed using a stripping technique to expose the remaining underlying portions of the un-plated seed metal 62. and the exposed portion of seed metal 62 is removed, such as by a subtractive etching process, leaving the completed first interconnect layer 32. The first interconnect layer 32 may then be capped with a capping layer 38 such as Eless Ni/Au or ENIPG, to provide a solderable wirebondable finish.

Figure 13:
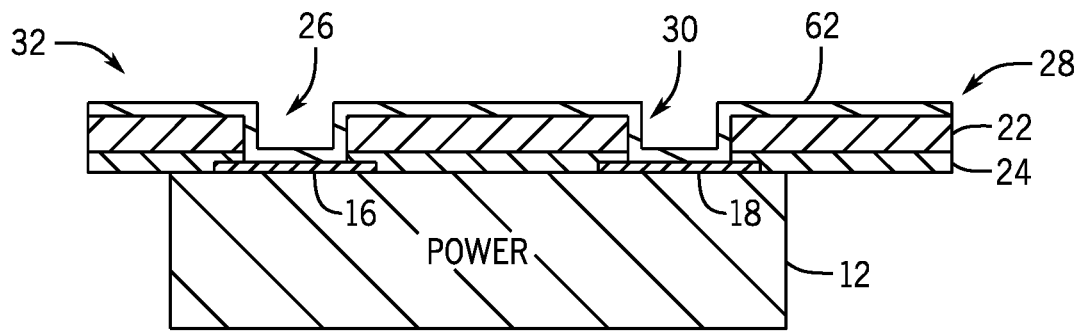
Figure 14:
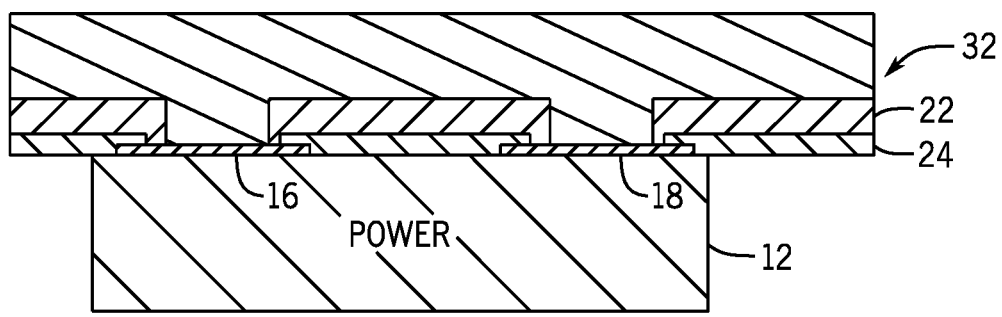
Figure 15:
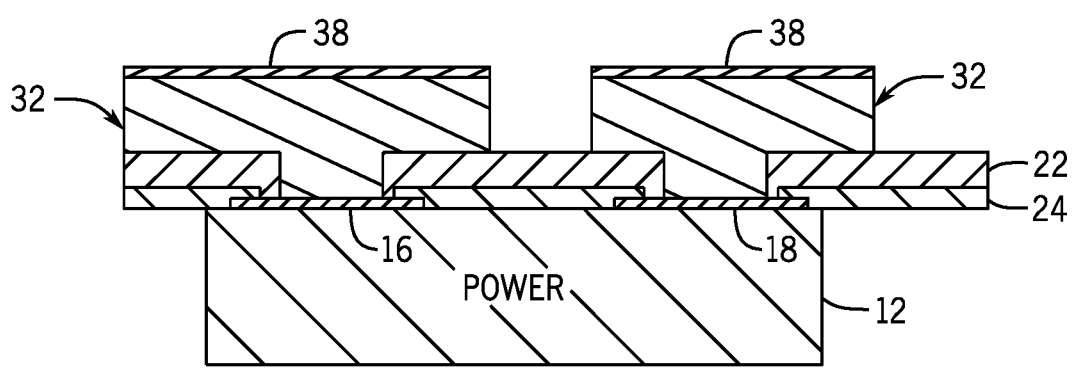

According to another embodiment, first interconnect layer 32 is formed using a subtractive process, as shown in FIGS. 13-15. In performing a subtractive process, manufacture of first interconnect layer 32 begins in FIG. 13 by applying a seed metal 62 to the second surface 28 of insulating substrate 22, onto the via walls 30 of vias 26, and onto exposed portions of the I/O pad(s) 16, 18. Seed metal 62 may be applied by sputtering, evaporation, electroless plating, or any other standard metal deposition process. A barrier coating (not shown) can optionally be applied prior to seed metal 62 to enhance adhesion and reliability. When used, the barrier metal likewise may be applied by sputtering, evaporation, or any other standard metal deposition process.

The seed metal 62 is then plated up with a bulk material (e.g., copper) by an electro-plating technique until first interconnect layer 32 reaches a desired thickness, as shown in FIG. 14. Following completion of the plating process, portions of the first interconnect layer 32 are selectively removed using a subtractive etching process, so as result in a selectively patterned, completed first interconnect layer 32 being formed, as shown in FIG. 15. The first interconnect layer 32 may then be capped with a capping layer such as Eless Ni/Au or ENIPG, to provide a solderable wirebondable finish.

It is to be understood that the semi-additive fabrication technique described with respect to FIGS. 9-12 and the subtractive fabrication technique described with respect to FIGS. 13-15 illustrate only two exemplary techniques for manufacturing first interconnect layer 32, and that any known metallization and patterning technique could be employed. In yet other embodiments, first interconnect layer 32 is a printed conductive material formed using a deposition technique such as inkjet printing, screen printing, or dispensing, as non-limiting examples. In yet another alternative embodiment, manufacture of electronics package 10 may begin by providing an insulating substrate 22 that includes pre-plated layer of conductive material.

While not illustrated in the technique of FIGS. 3-15, it is contemplated that the manufacturing technique of electronics package 10 may further include application/formation of additional insulating layers and interconnect layers that provide further redistribution of electrical connections between the power semiconductor chip 12 and external components. Additionally, one or more encapsulants or insulating materials over side and backside surfaces of power semiconductor chip 12 and/or over the exposed top surfaces of the first interconnect layer 32 and the insulating layer 22 may be performed and/or a series of input/output (I/O) connections may be formed to provide a route for electrical connections between the power semiconductor chip 12 and external components, as illustrated in FIG. 1.

Figure 16:
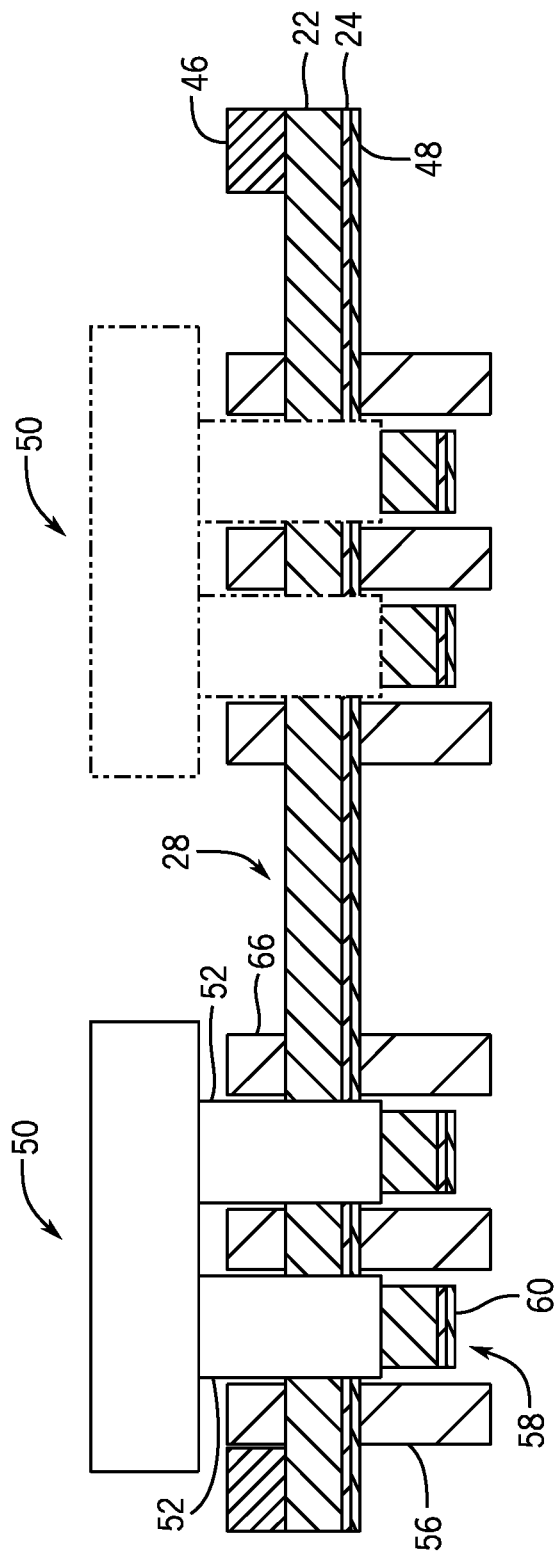
FIG. 16 is a schematic cross-sectional view of an electronics package, according to another embodiment of the invention.

Referring now to FIG. 16, use of a multi-punch mechanical punching tool 50 that is operable to simultaneously form a plurality of vias 26 in a single mechanical punch operation is illustrated, according to another embodiment of the invention. The multi-punch punching tool 50 includes a plurality of punches 52 that may be simultaneously actuated to punch out vias 26 through layers 22, 24, 48, with the multi-punch punching tool being shown as including two punches 52 in FIG. 16 but with it being recognized that a greater number of punches 52 could be used (e.g., three, four, etc.). Positioned on the opposite side of the electronics package 10, adjacent release liner 48, are dies 56 that interact with the multi-punch punching tool 50 to provide stability during via formation. Each of the dies 56 includes a hollow central area 58 that is aligned with a respective punch 52 of the punching tool 50, at locations where it is desired to form vias 26. According to one embodiment, a punching mold or "stripper" 66 is positioned on the second surface 28 side of the insulating substrate 22. The punching mold 66 functions to hold the electrically insulating substrate 22 during a punch and also enables improved alignment of the punches 52 with the dies 56.

In operation, the punches 52 are simultaneously actuated down to punch through the insulating substrate 22, adhesive layer 24, and release liner 48. Upon the punches 52 being actuated down to punch through the layers 22, 24, 48, the plugs 60 (of layers) cut from the via locations are punched out and exit through the hollow central areas 58 of the dies 56—with the resulting vias 26/via walls 30 having a structure such as that shown in FIG. 2 (i.e., protrusions 42 are formed on insulating substrate 22 that extend outwardly from the first surface 20 so as to cover all of or substantially all of the adhesive layer 24). With such a multi-punch mechanical punching tool 50, fabrication throughput of electronics packages 10 could be increased even further as compared to use of a mechanical punching tool 50 that includes only a single punch (FIG. 1).

Figure 17:
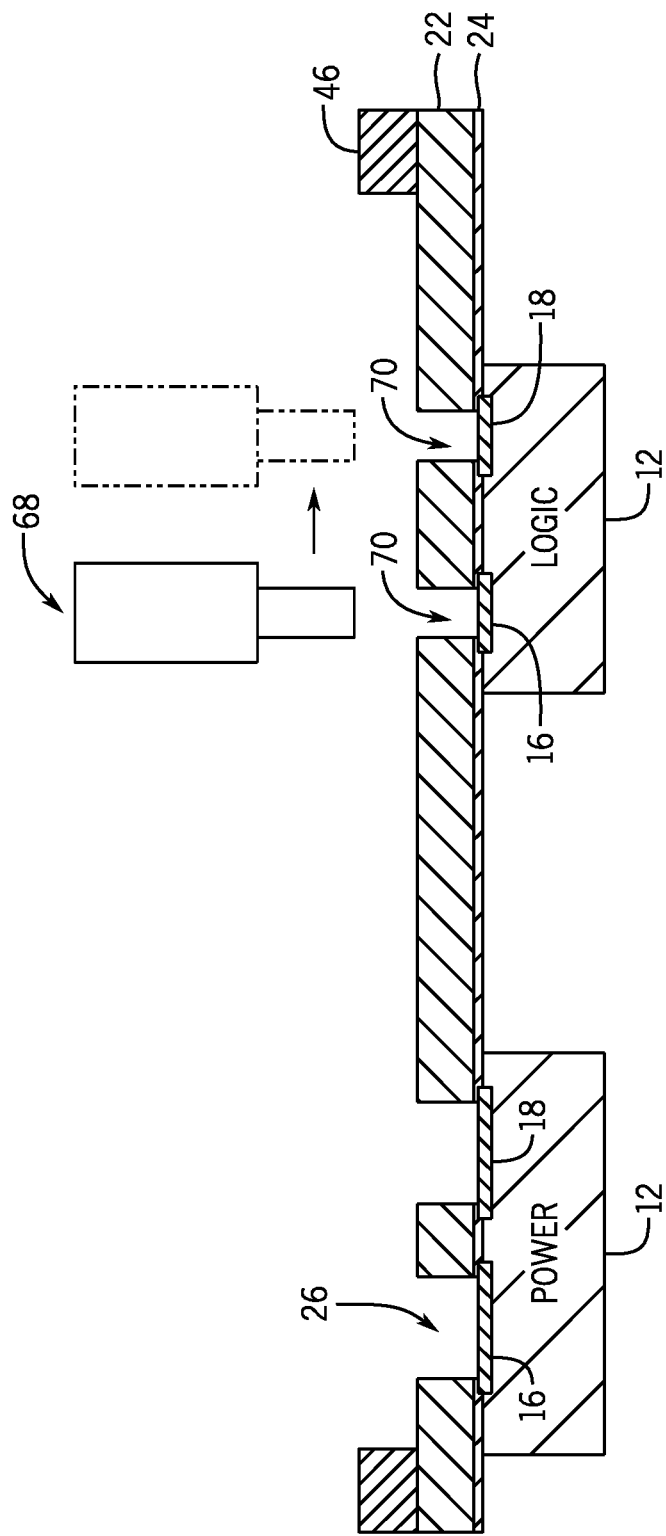
FIG. 17 is a schematic cross-sectional side view of an electronics package, where laser drilling is performed subsequent to a mechanical punching operation, according to an embodiment of the invention.

Referring now to FIG. 17, an embodiment of the invention is shown where a laser drilling step is performed after formation of vias using mechanical punching in order to provide for formation of smaller diameter vias, such as are required to provide connections to devices such as digital ASIC or driver circuits that have finer pad pitch or even smaller pad sizes. That is, after formation of vias 26 by way of a mechanical punching tool 50 (FIGS. 6 and 7), the mechanical punching tool 50 is removed and a separate laser drilling tool 68 is added, with the laser drilling tool 68 shown in FIG. 17 (and with punching tool 50 removed). After attachment of power and logic devices 12 and curing of the adhesive layer 24, a laser drilling step is performed using laser drilling tool 68 in order to make finer vias 70 (e.g., <50 micrometers in diameter).

Beneficially, embodiments of the invention thus provide an electronics package having vias formed by a mechanical punching operation. The formation of vias by way of a mechanical punching operation, through both an insulating substrate and adhesive layer and from the substrate side of the package, resulting in an improved throughput and yield of electronics package fabrication as compared to prior art processes. The fabricated electronics package includes an electrically insulating substrate and adhesive layer having vias formed therethrough each defined by a via wall, wherein at each via the electrically insulating substrate includes a protrusion extending outwardly from a surface thereof so as to cover at least part of the adhesive layer in forming part of the via wall. These protrusions function as a dam that prevents the flow or encroachment of adhesive into the vias, so as enable formation of vias having a consistent shape and that are more stable at high temperatures.

Therefore, according to one embodiment of the invention, an electronics package includes an electrically insulating substrate having a first surface and a second surface, an adhesive layer positioned on the first surface of the electrically insulating substrate, and an electrical component having a top surface coupled to the adhesive layer on a surface thereof opposite the electrically insulating substrate, the electrical component having one or more contact pads on the top surface. One or more vias are formed through the electrically insulating substrate and the adhesive layer at locations corresponding to respective ones of the one or more contact pads, each of the one or more vias having a via wall extending from the second surface of the electrically insulating substrate to a respective contact pad. At each via, the electrically insulating substrate comprises a protrusion extending outwardly from the first surface thereof so as to cover at least part of the adhesive layer in forming part of the via wall.

According to another embodiment of the invention, a method for manufacturing an electronics package includes providing an electrically insulating substrate, applying or forming an adhesive layer on a first surface of the electrically insulating substrate, and forming one or more vias through the electrically insulating substrate and the adhesive layer, each of the one or more vias defined by a via wall. The one or more vias are formed by mechanically punching the one or more vias through the electrically insulating substrate and the adhesive layer using a mechanical punching tool, with the one or more vias being mechanically punched through the electrically insulating substrate and the adhesive layer from a second surface side of the electrically insulating substrate, through the electrically insulating substrate and then through the adhesive layer.

According to still another embodiment of the invention, an electronics package is provided that is formed by a process including providing an electrically insulating substrate having a first surface and a second surface, applying or forming an adhesive layer on the first surface of the electrically insulating substrate, and forming one or more vias through the electrically insulating substrate and the adhesive layer by mechanically punching the one or more vias through the electrically insulating substrate and the adhesive layer using a mechanical punching tool positioned on the second surface side of the electrically insulating substrate, each of the one or more vias defined by a via wall. The mechanical punching of the one or more vias through the electrically insulating substrate and the adhesive layer from the second surface side of the electrically insulating substrate forms a protrusion on the electrically insulating substrate at each via that extends outwardly from the first surface, so as to cover at least part of the adhesive layer and form part of the via wall.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
    an electrically insulating substrate having a first surface and a second surface;
    an adhesive layer positioned on the first surface of the electrically insulating substrate; and
    an electrical component having a top surface coupled to the adhesive layer on a surface thereof opposite the electrically insulating substrate, wherein the electrical component has one or more contact pads on the top surface; and
    one or more vias formed through the electrically insulating substrate and the adhesive layer, wherein the one or more vias are equal in number to the one or more contact pads, wherein each of the one or more vias is formed at a separate location corresponding to a respective contact pad of the one or more contact pads, wherein each of the one or more vias has a via wall extending from the second surface of the electrically insulating substrate to the respective contact pad of the one or more contact pads;
    wherein the electrically insulating substrate comprises one or more protrusions equal in number to the one or more vias, wherein each of the one or more protrusions extends outwardly from the first surface of the electrically insulating substrate at a respective via of the one or more vias to cover at least part of the adhesive layer in forming at least part of the via wall of the respective via of the one or more vias.

2. The electronics package of claim 1 wherein each of the one or more protrusions is formed around a perimeter of the respective via of the one or more vias and extends outwardly from the first surface of the electrically insulating substrate so as to cover at least 50% of a thickness of the adhesive layer as part of the via wall of the respective via of the one or more vias.

3. The electronics package of claim 2 wherein each protrusion of the one or more protrusions covers all of or substantially all of the thickness of the adhesive layer as part of the via wall of the respective via of the one or more vias.

4. The electronics package of claim 1 wherein a diameter of each of the one or more vias is equal to or greater than 80 micrometers.

5. The electronics package of claim 1 wherein each protrusion of the one or more protrusions blocks a flow of the adhesive layer into the respective via of the one or more vias.

6. The electronics package of claim 1 further comprising an interconnect layer formed on the second surface of the electrically insulating substrate and in the one or more vias, wherein the interconnect layer is electrically coupled to the one or more contact pads of the electrical component.

7. The electronics package of claim 1 wherein the adhesive layer comprises a bonding material that is non-electrically conducting.

8. The electronics package of claim 1 wherein each protrusion of the one or more protrusions covers less than 100% of a thickness of the adhesive layer as part of the via wall of the respective via of the one or more vias.

9. A method for manufacturing an electronics package comprising:
    applying or forming an adhesive layer on a first surface of an electrically insulating substrate;
    mechanically punching with a mechanical punching tool through the electrically insulating substrate and the adhesive layer from a second surface of the electrically insulating substrate opposite the first surface of the electrically insulating substrate to form one or more vias through the electrically insulating substrate and the adhesive layer, wherein each of the one or more vias is defined by a via wall comprising a protrusion of the electrically insulating substrate formed around a perimeter of each of the one or more vias as a result of the mechanical punching, wherein each protrusion extends from the first surface of the electrically insulating substrate to cover at least a portion of the adhesive layer; and
    attaching an active surface of a first electrical component to the adhesive layer, wherein one or more contact pads are positioned on the active surface of the first electrical component, wherein each of the one or more contact pads is positioned at a respective via of the one or more vias.

10. The method of claim 9 wherein at least one via of the one or more vias has a diameter of 80 to 100 micrometers; and
    further comprising laser drilling the at least one via of the one or more vias after mechanically punching the one or more vias.

11. The method of claim 9 further comprising:
attaching an active surface of a second electrical component to the adhesive layer, wherein one or more contact pads are positioned on the active surface of the second electrical component; and
laser drilling one or more finer vias through the electrically insulating substrate and the adhesive layer to expose the one or more contact pads of the second electrical component, wherein each of the one or more finer vias has a diameter smaller than that of each of the one or more vias.

12. The method of claim 9 further comprising:
applying a release liner to the adhesive layer prior to mechanically punching with the mechanical punching tool such that mechanical punching tool mechanically punches through the electrically insulating substrate, the adhesive layer, and the release liner; and
removing the release liner after mechanically punching with the mechanical punching tool and prior to attaching the active surface of the first electrical component to the adhesive layer.

13. The method of claim 12 further comprising, prior to mechanically punching with the mechanical punching tool, positioning a plurality of dies on a surface of the release liner opposite the adhesive layer such that, between every two adjacent dies of the plurality of dies, is a hollow central area for alignment with the mechanical punching tool at a location where a respective via of the one or more vias is to be formed.

14. The method of claim 13 further comprising, prior to mechanically punching with the mechanical punching tool, positioning a punching mold on the second surface of the electrically insulating substrate to align the mechanical punching tool with each hollow central area.

15. The method of claim 9 further comprising, prior to applying or forming the adhesive layer on the first surface of the electrically insulating substrate, securing the second surface of the electrically insulating substrate to a perimeter frame.

16. The method of claim 9 wherein the mechanical punching tool is a multi-punch mechanical punching tool that simultaneously forms multiple vias with each punch.

17. The method of claim 9 further comprising forming an electrically conductive interconnect layer on at least a portion of the second surface of the electrically insulating substrate, within the one or more vias, and to each of the one or more contact pads of the first electrical component.

18. An electronics package, the electronics package formed by a process comprising:
applying or forming an adhesive layer on a first surface of an electrically insulating substrate;
applying a release liner on a surface of the adhesive layer opposite the electrically insulating substrate;
mechanically punching with a mechanical punching tool through the electrically insulating substrate, the adhesive layer, and the release liner from a second surface of the electrically insulating substrate opposite the first surface of the electrically insulating substrate to form:
one or more vias extending through the electrically insulating substrate, the adhesive layer, and the release liner, wherein each of the one or more vias is defined by a via wall; and
within each of the one or more vias, a protrusion extending from the first surface of the electrically insulating substrate to cover at least a portion of the adhesive layer in forming at least a portion of the via wall of a respective via of the one or more vias;
removing the release liner from of the adhesive layer; and
attaching an active surface of a first electrical component to the adhesive layer, wherein one or more contact pads are positioned on the active surface of the first electrical component, wherein each of the one or more contact pads is positioned at a respective via of the one or more vias.

19. The electronics package of claim 18 wherein the process for forming the electronics package further comprises:
attaching an active surface of a second electrical component to the adhesive layer, wherein one or more contact pads are positioned on the active surface of the second electrical component; and
laser drilling one or more finer vias through the electrically insulating substrate and the adhesive layer to expose the one or more contact pads of the second electrical component, wherein each of the one or more finer vias has a diameter smaller than that of each of the one or more vias.

20. The electronics package of claim 19 wherein the process for forming the electronics package further comprises forming an electrically conductive interconnect layer on at least a portion of the second surface of the electrically insulating substrate and within each of the one or more vias, within each of the one or more finer vias, and to the one or more contact pads of the first and second electrical components.

21. The electronics package of claim 18 wherein the process for forming the electronics package further comprises, prior to mechanically punching with the mechanical punching tool:
positioning a plurality of dies on a surface of the release liner opposite the adhesive layer to form at least one hollow central area therebetween; and
aligning the mechanical punching tool with the at least one hollow central area.

22. The electronics package of claim 21 wherein the process for forming the electronics package further comprises, prior to mechanically punching with the mechanical punching tool, positioning a punching mold on the second surface of the electrically insulating substrate to align the mechanical punching tool with the at least one hollow central area.

23. The electronics package of claim 18 wherein mechanically punching with the mechanical punching tool in the process for forming the electronics package comprises mechanically punching with a multi-punch mechanical punching tool that simultaneously forms multiple vias with each punch.

* * * * *